US006171900B1

United States Patent
Sun

(10) Patent No.: US 6,171,900 B1
(45) Date of Patent: Jan. 9, 2001

(54) CVD TA$_2$O$_5$/OXYNITRIDE STACKED GATE INSULATOR WITH TIN GATE ELECTRODE FOR SUB-QUARTER MICRON MOSFET

(75) Inventor: Shi-Chung Sun, Los Altos, CA (US)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/292,354

(22) Filed: Apr. 15, 1999

(51) Int. Cl.$^7$ ...................... H01L 21/8242; H01L 21/336
(52) U.S. Cl. ........................... 438/240; 438/261; 438/197
(58) Field of Search .................... 438/260, 261, 438/257, 258, 263, 240, 197, 199, 216

(56) References Cited

U.S. PATENT DOCUMENTS

| 5,304,503 | 4/1994 | Yoon et al. | 437/43 |
|---|---|---|---|
| 5,324,675 | 6/1994 | Hagabuchi | 437/42 |
| 5,668,028 | 9/1997 | Bryant | 438/287 |
| 5,985,730 | * 11/1999 | Lim | 438/393 |
| 5,998,264 | * 12/1999 | Wu | 438/260 |
| 6,004,850 | * 12/1999 | Lucas et al. | 438/301 |
| 6,093,590 | * 7/2000 | Lou | 438/197 |

OTHER PUBLICATIONS

Iwai et al., Analysis of an ONO gate film effect on n–and p–MOSFET mobilities, IEEE, 131–132, 1990.*
Maiti et al., PVD TiN Metal Gate MOSFETs on Bulk Silicon and Fully Depleted Silicon–On–Insulator (FDSOI) Substrate for Deep Sub–Quarter Micron CMOS Technology, IEEE, 781–784, 1998.*
Momose et al., Improvement of direct–tunneling gate leakage current in ultra–thin gate oxide CMOS with TiN gate electrode using non–doped selective epitaxial Si channel technique, IEEE, 819–822, 1999.*

Wolf, "Silicon Processing for the VLSI Era", vol. 2: Process Integration, Lattice Press, Sunset Beach, CA (1990), pp. 298–300 and p. 315.

Wolf, "Silicon Processing for the VLSI Era", vol. 1, Process Technology, Lattice Press, Sunset Beach, CA (1986) p. 290.

* cited by examiner

Primary Examiner—Trung Dang
Assistant Examiner—Brook Kebede
(74) Attorney, Agent, or Firm—George O. Saile; Stephen B. Ackerman

(57) ABSTRACT

A method of fabricating a CVD Ta$_2$O$_5$/Oxynitride stacked gate insulator with TiN gate electrode for sub-quarter micron MOSFETs is disclosed. In a first embodiment, the surface of a silicon substrate is reacted in N$_2$O or NO ambient to form an oxynitride layer. Tantalum oxide is next chemical vapor deposited, thus forming a Ta$_2$O$_5$/Oxynitride stacked gate insulator. The stacked gate is then completed by depositing titanium nitride as the gate electrode and then patterning and forming the gate structure. In the second embodiment, a gate oxide is first formed on the silicon substrate. Then the gate oxide layer is nitridated in N$_2$O or NO ambient to form the oxynitridated layer, thus forming a two-step oxynitride layer. The tantalum oxide layer and the titanium nitride gate electrode are formed as in the first embodiment. It is disclosed in the present invention that by replacing the conventional SiO$_2$ layer with a composite layer of Ta$_2$O$_5$/oxynitride, where the oxynitride dielectric layer is grown in a nitrogen ambient, charge trapping, interface state generation, and breakdown field distribution, the time-dependent dielectric breakdown (TDDB) of gate oxides and hence the reliability of MOSFET devices are improved substantially.

22 Claims, 4 Drawing Sheets

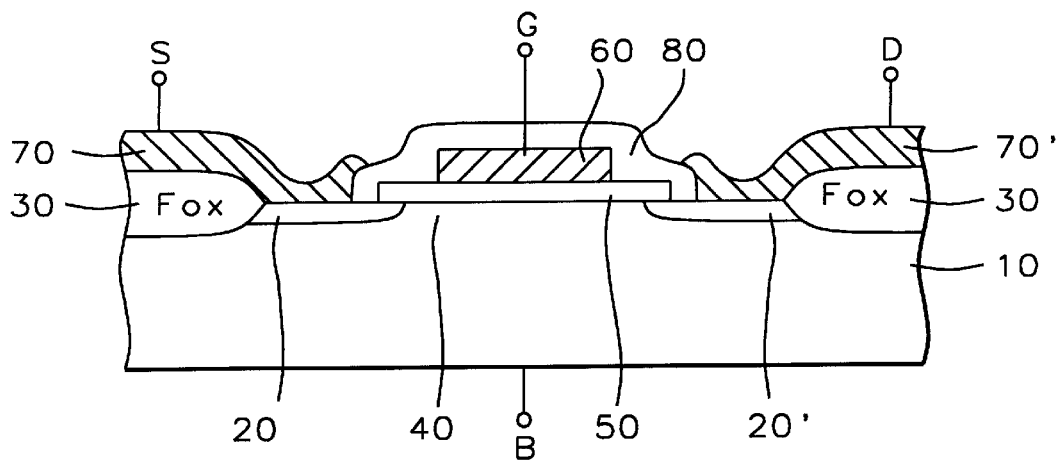
FIG. 1 – Prior Art
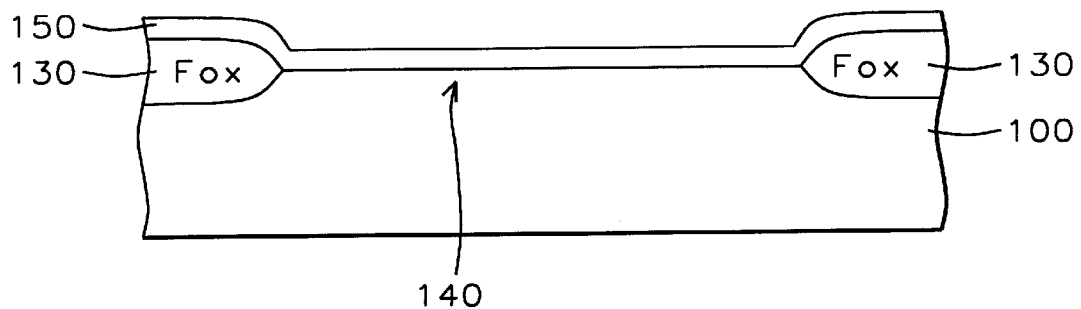
FIG. 2a
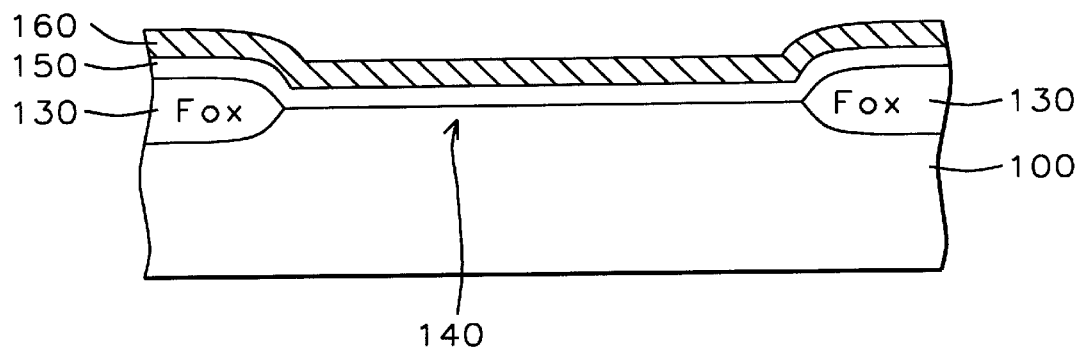
FIG. 2b

CVD TA₂O₅/OXYNITRIDE STACKED GATE INSULATOR WITH TIN GATE ELECTRODE FOR SUB-QUARTER MICRON MOSFET

BACKGROUND OF THE INVENTION (1) Field of the Invention

The present invention relates to the manufacture of semiconductor devices, and in particular, to a method of forming a stacked gate insulator in sub-quarter micron MOSFETs.

(2) Description of the Related Art

A MOSFET (metal-oxide-semiconductor field-effect transistor) device of related art is shown in FIG. 1. As described fully in S. Wolf and R. N. Tauber, "Silicon Processing for the VLSI Era," vol. 2, Lattice Press, Sunset Beach, Calif, 1990, pp. 298–300, the device is formed on a substrate which is a silicon wafer (10). Of the key elements of the device, a gate electrode (60) is formed over a gate oxide insulator (50) that separates the former from the semiconductor substrate (10) as shown in FIG. 1. A channel region (40) under gate oxide (50) further separates source (20) and drain (20') regions. The source and drain regions are heavily doped while the channel region is lightly doped with a dopant type opposite to that of the source and drain. Gate (60), source (20) and drain (20') regions are connected to their respective terminals (G), (S), and (D) via conductors (60), (70), and (70') as shown in FIG. 1. Normally, input signal is applied to the gate terminal (G) and the output voltage is developed across the source (S) and drain (D) terminals through which the output current, i.e., drain-source current, $I_{DS}$ flows. Since the semiconductor is physically separated from the gate electrode by the gate oxide insulating layer (typically, $SiO_2$), no current flows between the gate electrode and the semiconductor.

As is well known (See Wolf, above), the operation of an MOS transistor involves the application of an input voltage to gate electrode (60), which sets up a transverse electric field in channel region (40) of the device. By varying this transverse electric field, it is possible to modulate the longitudinal conductance of the channel region. Since an electric field controls current flow, such devices are termed field-effect transistors (FETs). They are further described as metal-oxide-semiconductor (MOS) FETs because of the thin $SiO_2$ layer that separates the gate and substrate. We note for completeness that the active or transistor regions where the transistor action occurs are the channel (40) and the heavily doped source and drain regions (20) and (20'), respectively. Active regions on substrate (10) are separated from each other by passive regions (30) which are formed by growing a thick oxide layer (field oxide).

One of the important desired properties of MOSFETs is high output current drive which is inversely proportional to the thickness of the gate oxide. For this reason, gate oxide thickness has grown smaller with each generation of MOS integrated circuits. The present trend is towards oxide thicknesses less than 5 nanometers (nm) as MOSFETs are being scaled below quarter micron. However, below around 5 nm, there is a finite probability that electrons will pass through the gate oxide by means of a quantum-mechanical tunneling effect. For proper device operation, the tunneling current must be small. This effect, as Wolf cited above points out on p. 315, sets a fundamental lower limit of about 5 nm for the thickness of the gate oxide. Alternative gate dielectric materials, including nitrided oxides, thermal nitrides and tantalum oxide have been explored to mitigate this limitation. Since these materials have a larger dielectric constant than that of $SiO_2$, they can be made thicker than the latter, while keeping the same capacitance per unit area and hence the same switching speed of the device. In fact, Yoon, et al., in U.S. Pat. No. 5,304,503 teach the substitution of tantalum oxide for conventional oxide-nitride-oxide (ONO) composite as the control gate dielectric for this purpose. Bryant in U.S. Pat. No. 5,668,028, on the other hand, teaches the depositing of a thin nitride layer in the forming of a gate structure comprising an oxide layer, a nitride layer and a polysilicon layer. A different gate insulating layer of a triplex structure is proposed by Hayabuchi in U.S. Pat. No. 5,324,675 where a first oxide layer, an oxidation-resistant layer and a second oxide layer are successively formed on a semiconductor substrate.

In addition to the thickness, there are other gate oxide characteristics that need to be addressed in the manufacture of MOSFETs. High quality $SiO_2$ films typically break down at electric fields of 5–10 megavolts (MV)/cm. However, breakdown may also occur at smaller electric-field values as a result of process-induced flaws in the gate oxide. Such defects include: metal precipitates on the silicon surface prior to oxide growth; high defect density in the silicon lattice at the substrate surface, e.g., stacking faults and dislocations; pinholes and weak spots created in the gate oxide by particulates; thinning of the oxide during growth; and oxide wearout due to failure mechanism related to hot-electron injection. Furthermore, the $Si/SiO_2$ interface on the surface of the semiconductor substrate must exhibit sufficiently small collection of different types of charges relating to the reliability of submicron MOSFETs.

Without giving all the details that can be found elsewhere and not to obscure the key points of the present invention, it is sufficient to mention here by name the four types of charges that are associated with $Si-SiO_2$ interfaces which affect the performance of MOSFETs. They are: fixed oxide charges found within approximately 30Å of the $Si-SiO_2$ interface; mobile ionic charges which mostly arise from sodium or potassium ions in the oxide layer; interface trapped charges referred to as interface states; and oxide trapped charges due to holes or electrons trapped in the bulk of the oxide. Generally, the occurrence of these charges are not well understood and several models have been proposed to explain them. However, it has been observed in the present state of the manufacturing line that these charge impediments can be reduced substantially by forming different composite structures of gate oxide insulating layers. It is disclosed in the present invention that by replacing the conventional $SiO_2$ layer with a composite layer of $Ta_2O_5$/oxynitride, charge trapping, interface state generation, and breakdown field distribution, the time-dependent dielectric breakdown (TDDB) of gate oxides and hence the reliability of MOSFET devices can be improved substantially.

SUMMARY OF THE INVENTION

It is therefore an object of this invention to provide a CVD Ta2O5/Oxynitride stacked gate insulator with TiN gate electrode for sub-quarter micron MOSFETs.

It is another object of this invention to provide a method of forming a CVD $Ta_2O_5$/Oxynitride stacked gate insulator with TiN gate electrode for sub-quarter micron MOSFETs.

It is yet another object of this invention to provide a method of forming a stacked gate insulator with improved time-dependent dielectric breakdown (TDDB) and reliability.

These objects are accomplished by providing a silicon substrate; oxynitridating the surface of the silicon in an $N_2O$ or NO ambient to form a layer of oxynitride; forming a $N_2O$ or NO ambient to form a layer of oxynitride; forming a tantalum oxide layer over the layer of oxynitride; forming a titanium nitride layer over the tantalum oxide layer; and patterning and etching the layers of oxynitride, tantalum oxide and titanium nitride to complete the forming of the $Ta_2O_5$/Oxynitride stacked gate.

The objects are further accomplished in a second embodiment by providing a semiconductor substrate; forming a layer of gate oxide over the semiconductor substrate; oxynitridating the layer of gate oxide first in an $O_2$ environment and then in a $N_2O$ or NO ambient to form a layer of two-step oxynitride; forming a tantalum oxide layer over the layer of two-step oxynitride; forming a titanium nitride layer over said tantalum oxide layer; and patterning and etching said oxynitride, tantalum oxide and titanium layers to complete the forming of said stacked gate.

The objects are also accomplished by forming a gate insulator composite structure comprising a layer of two-step oxynitride and a layer of tantalum oxide formed on a semiconductor substrate; and a titanium nitride gate electrode formed on the thusly formed $Ta_2O_5$/Oxynitride stacked insulator composite for sub-quarter micron MOSFETs.

BRIEF DESCRIPTION OF THE DRAWINGS

FIG. 1 is a partial cross-sectional view of a MOS device of prior art.

FIG. 2a is a partial cross-sectional view of a semiconductor substrate showing the forming of oxynitride layer according to this invention.

FIG. 2b is a partial cross-sectional view of a semiconductor substrate showing the forming of $Ta_2O_5$ layer according to this invention on the oxynitride layer of FIG. 2a of this invention.

DESCRIPTION OF THE PREFERRED EMBODIMENTS

Figure 2C:
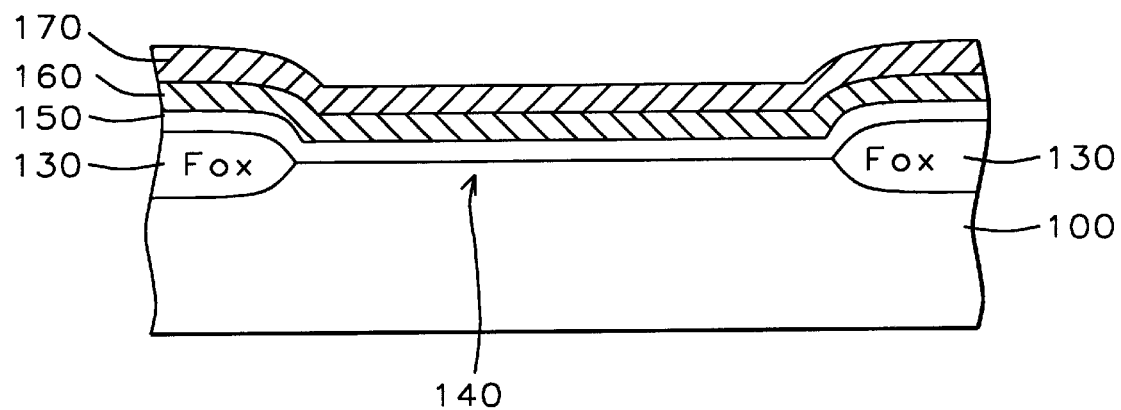
FIG. 2c is a partial cross-sectional view of a semiconductor substrate showing the forming of TiN layer according to this invention on the $Ta_2O_5$ layer of FIG. 2b of this invention.

As the very large scale integrated circuits (VLSI) are further being scaled down to ultra large scale integrated circuits (ULSI) where the feature sizes can be less than quarter micron, the gate and tunnel dielectric thicknesses are also being scaled down to less than 100 Å. Although very thin oxides can be grown by a number of well-known techniques, very thin layers of $SiO_2$ are known to have high defect densities. As an alternative, a new technique, known as thermal nitridation of Si and $SiO_2$ has been developed where thin dielectrics with good characteristics can be formed. Thus, MOS devices fabricated with thermally grown films of silicon nitride are found to have large values of gain and reduced hot electron effects.

Thermal silicon nitride films are generally grown by the high temperature (950–1200° C.) nitridation of silicon in pure ammonia or an ammonia plasma, as described in S. Wolf and R. N. Tauber, "Silicon Processing for the VLSI Era," vol. 1, Lattice Press, Sunset Beach, Calif., 1990, p.290. They can also be prepared by plasma anodic nitridation using a nitrogen-hydrogen plasma in the temperature range of 700–900° C. However, the presence of temperature range of 700–900° C. However, the presence of hydrogen and moisture, in general, in these procedures is believed to contribute to interface-state generation by hot-carriers, and higher densities of positive fixed charges, and ultimately to degraded time-dependent dielectric breakdown (TDDB) of gate oxides.

The present invention discloses a method of forming a gate oxide-nitride through direct nitridation of silicon where oxidation and nitridation occur simultaneously, i.e., oxynitridation of silicon; and another method where gate oxide is first formed and then nitridated, i.e., oxynitridation of oxide-both formed in NO, or in nitrous oxide ($N_2O$) ambient.

Referring now to the drawings, in particular to FIGS. 2a–2d, there are shown schematically steps of forming a CVD Ta2O5/Oxynitride stacked gate on a semiconductor substrate (100). The substrate is typically a monocrystalline silicon of a conventional crystal orientation known in the art and includes active region (140) and passive regions (130) which have already been defined. The methods disclosed in this invention are applicable to devices employing semiconductor materials other than silicon as will be appreciated by those skilled in the art. Substrate may be either p-type substrate or an n-type substrate.

In the first embodiment of this invention, the silicon surface of substrate (100) is directly reacted with $N_2O$ or NO in an rapid thermal processing (RTP) chamber. This is accomplished at a temperature between about 850 to 1100° C. and for a duration between about 30 to 60 seconds after which oxynitride layer (150) is formed to a thickness between about 10 to 60 Å. Next, tantalum oxide, preferably $Ta_2O_5$, is deposited by chemical vapor deposition (CVD) at a chamber pressure between about 50 to 100 pascal (Pa), temperature between about 400° C. to 475° C. with reactant gas -$Ta(OC_2H_5)_5$ at a flow rate between about 5 to 20 (sccm) in $N_2$ carrier gas and $O_2$ at a flow rate between about 10 to 40 sccm forming layer (160) shown in FIG. 2b. The preferred thickness of $Ta_2O_5$ is between about 50 to 100 Å. Alternatively, tantalum oxide may be deposited by sputtering or by electron-beam evaporation. This is followed by sputtering of titanium in nitrogen ambient to form titanium nitride (TiN) layer (170) shown in FIG. 2c to a thickness between about 100 to 500 Å.

Figure 2D:
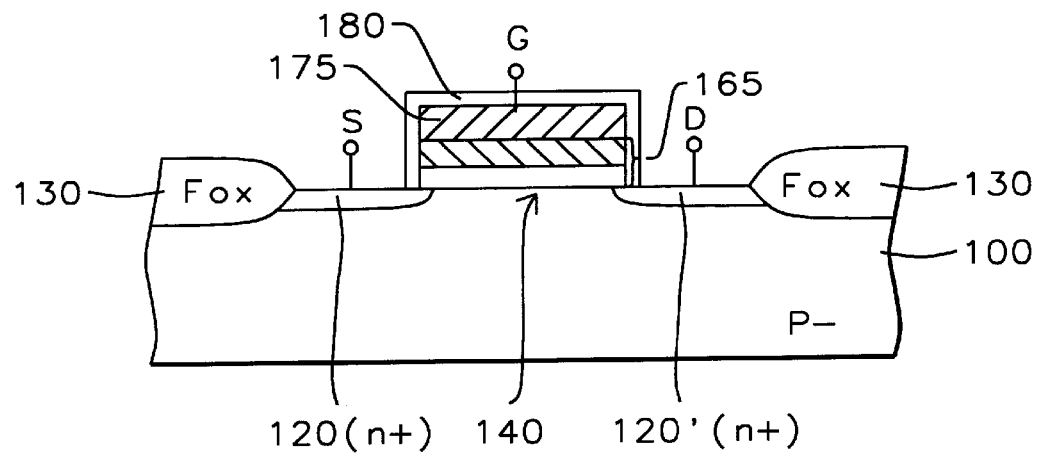
FIG. 2d is a partial cross-sectional view of a semiconductor substrate showing the forming of $Ta_2O_5$/oxynitride gate insulator with TiN gate electrode according to this invention.

Thereafter, the MOSFET device shown in FIG. 2d is patterned and etched to expose source (120) and drain (120') regions in selected portions wherein stacked gate insulator structure (165) comprising $Ta_2O_5$/oxynitride is formed with a TiN gate electrode (175) integrally formed thereon.

In a second embodiment, layer (150) of FIG. 2a is formed in a two-step oxynitridation process where in the first step of the process, a layer of gate oxide is formed by thermal oxidation of the silicon surface of substrate (100) at a temperature between about 750 to 900° C. The preferred thickness of the gate oxide so formed is between about 10 to 60 Å. Then, the gate oxide is subjected to nitridation through annealing in $N_2O$ or NO, thus forming oxynitride layer (150') of a thickness between about 10 to 60 Å. For succinctness, layer (150') of second embodiment is represented as layer (150) of the first embodiment shown in FIG. 2b. This second step of oxynitridation is accomplished either by rapid thermal nitridation at a temperature between about 800 to 1000° C. for a duration between about 30 to 60 seconds, or in a furnace at a temperature between about 800 to 1000° C., and for a duration of between about 5 to 30 minutes.

The remaining steps of the second embodiment follow that of the first embodiment disclosed above, namely, tantalum oxide, preferably $Ta_2O_5$, is deposited by chemical vapor deposition (CVD) at a chamber pressure between about −50 to 100 Pa, temperature between about 400° C. to 475° C. with reactant gas $Ta(OC_2H_5)_5$ at a flow rate between about 5 to 20 (sccm) in $N_2$ carrier gas and $O_2$ at a flow rate between about 10 to 40 sccm forming layer (160) shown in FIG. 2b. The preferred thickness of $Ta_2O_5$ is between about 50 to 100 Å. Alternatively, tantalum oxide may be deposited by sputtering or by electron-beam evaporation. This is followed by sputtering of titanium in nitrogen ambient to form nitride (TiN) layer (170) shown in FIG. 2c to a thickness between about 100 to 500 Å.

Thereafter, the MOSFET device shown in FIG. 2d is patterned and etched to expose source (120) and drain (120') regions in selected portions wherein stacked gate insulator structure (165) comprising $Ta_2O_5$/oxynitride is formed with a TiN gate electrode (175) integrally formed thereon.

The subsequent steps of completing the fabrication of a MOSFET device shown in FIG. 2d are well known in the art and will not be discussed here in detail. It will be briefly noted that after the forming of $Ta_2O_5$/Oxynitride stacked gate insulator (165) with TiN gate electrode (175), a conformal oxide layer (180) is formed around the stacked gate structure. This is followed by performing implantation to produce source and drains for the MOSFET device. For example, n-type impurities may be implanted into a p-type substrate. The fabrication of the MOSFET device is then completed by forming conductors connecting gate electrode (175), and source (120) and drain (120') regions to their respective gate, source and drain terminals shown in FIG. 2d.

Figure 3A:
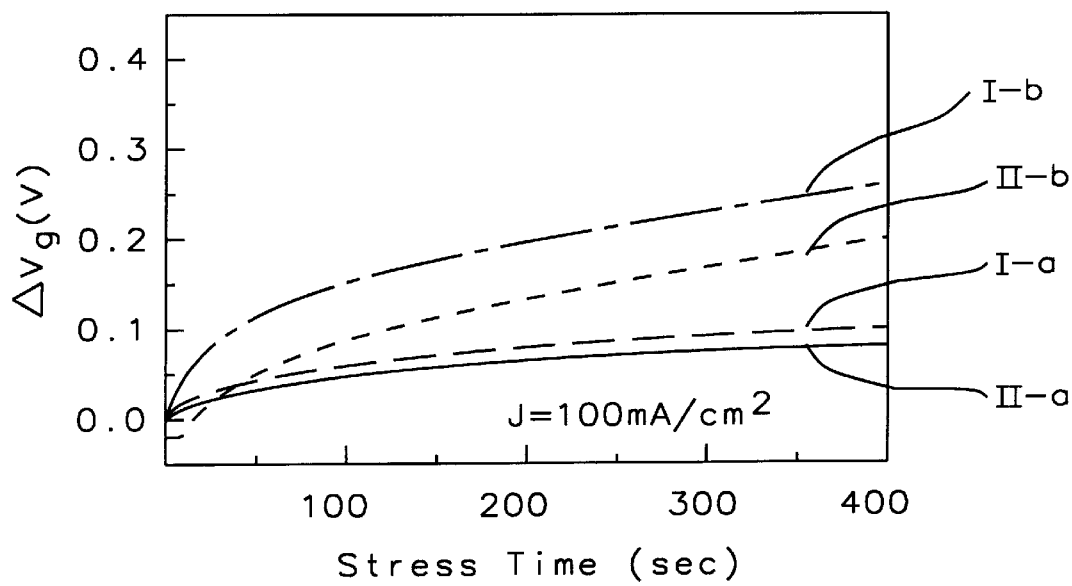
FIG. 3a is a graph showing the charge trapping characteristics of conventional $O_2$-grown $Ta_2O_5$/$SiO_2$ gate dielectrics as compared with those of the $N_2O$-grown $Ta_2O_5$/$SiO_2$ gate dielectrics of this invention.

FIGS. 3a–3d show the experimental results obtained from device samples fabricated following the methods disclosed in this invention. In FIGS. 3a–3d, experimental results are indicated as follows:

I-a—$O_2$-grown $Ta_2O_5/SiO_2$—10 nm/3 nm
II-a—$N_2O$-grown $Ta_2O_5/SiO_2$—10 nm/3 nm
I-b—$O_2$-grown $Ta_2O_5/SiO_2$—10 nm 16 nm
II-b—$N_2O$-grown $Ta_2O_5/SiO_2$—10 nm/6 nm. In FIG. 3a, interface charge trapping characteristics of $O_2$-grown $Ta_2O_5/SiO_2$ gate dielectrics is compared with those that are $N_2O$-grown, that is, grown in $N_2O$ environment. As it will be understood by those in the field, interface trap charge refers to charge which is localized at the Si—$SiO_2$ interface on sites that can change their charge state by exchange of mobile carriers (electrons or holes) with the silicon. In FIG. 3a, trapping characteristics is measured in terms of $\Delta V_{gate}$ versus stress time in seconds at a current density of 100 milliamps (mA)/$cm^2$. It is seen from the legend in FIG. 3a that the $N_2O$-grown oxides, that is, oxynitrides of this invention of two different combinations of thicknesses, namely, $Ta_2O_5$/oxynitride formed in $N_2O$ of 10 nm/6 nm and 10 nm/3 nm have less interface trapping than the corresponding composites of stacked gate insulators formed of $SiO_2$ grown in $O_2$ ambient.

Figure 3B:
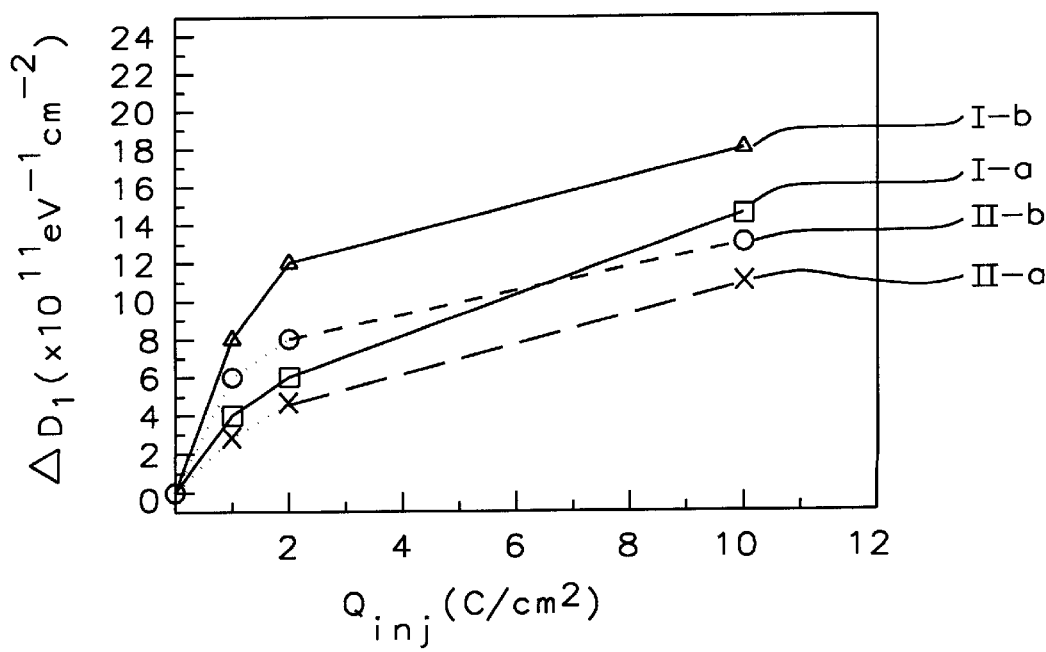
FIG. 3b is a graph showing the interface state generation characteristics of conventional $O_2$-grown $Ta_2O_5$/$SiO_2$ gate dielectrics as compared with those of the $N_2O$-grown $Ta_2O_5$/$SiO_2$ gate dielectrics of this invention.
Figure 3C:
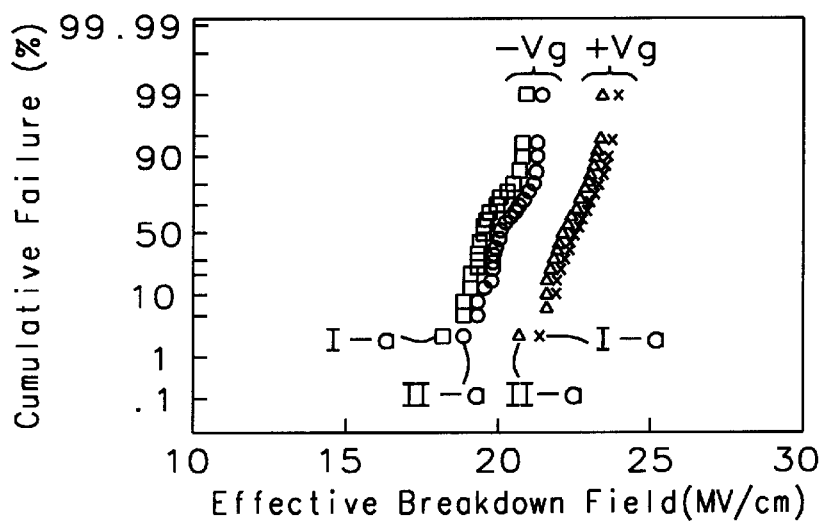
FIG. 3c is a graph showing the effective breakdown field of conventional $O_2$-grown $Ta_2O_5$/$SiO_2$ gate dielectrics as compared with those of the $N_2O$-grown $Ta_2O_5$/$SiO_2$ gate dielectrics of this invention.
Figure 3D:
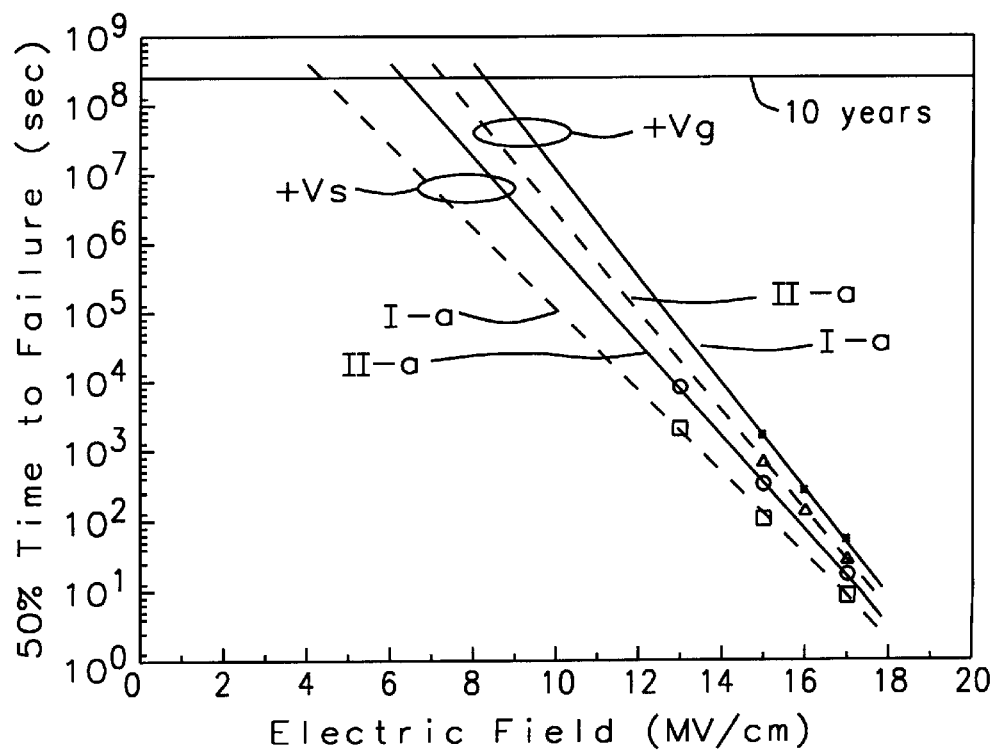
FIG. 3d is a graph showing the time-dependent dielectric breakdown (TDDB) characteristics of conventional $O_2$-grown $Ta_2O_5$/$SiO_2$ gate dielectrics as compared with those of the $N_2O$-grown $Ta_2O_5$/$SiO_2$ gate dielectrics of this invention.

Similarly, in a separate experiment using stacked capacitors having different dielectrics as a test, interface generation with $Ta_2O_5$/oxynitride dielectrics formed in $N_2O$ was less, and therefore, more desirable, than with $SiO_2$ dielectric composite grown in $O_2$ as shown in FIG. 3b. In still another experiment, the effective breakdown field (MV/cm) of composite $Ta_2O_5$/oxynitride insulator was found to be considerably higher than with $SiO_2$ grown in $O_2$ as shown in FIG. 3c. Finally, the time-dependent dielectric breakdown (TDDB) characteristics of gate insulators measured in terms of 50% time to failure shown in FIG. 3d also was found to be much improved with insulators formed of $Ta_2O_5$/oxynitride grown in $N_2O$. As a result, the reliability of MOSFET devices have been improved substantially.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a CVD $Ta_2O_5$/Oxynitride stacked gate insulator with TiN gate electrode for sub-quarter micron MOSFETs comprising the steps of:

providing a semiconductor substrate;

oxynitridation of the surface of said substrate to form a layer of oxynitride;

forming a tantalum oxide layer over said layer of oxynitride;

forming a titanium nitride layer over said tantalum oxide layer; and patterning and etching said oxynitride, tantalum oxide and titanium layers to complete the forming of said stacked gate.

2. The method of claim 1, wherein said semiconductor substrate is silicon.

3. The method of claim 1, wherein said surface of said substrate is a silicon surface.

4. The method of claim 1, wherein said oxynitridation of said surface is performed by reacting $N_2O$ or NO at silicon surface.

5. The method of claim 1, wherein said oxynitridation is performed in a furnace at a temperature between about 850 to 1100° C. for between about 5 to 30 minutes.

6. The method of claim 1, wherein said oxynitridation is performed in rapid thermal chamber at a temperature between about 850 to 1100° C. for a duration between about 30 to 60 seconds.

7. The method of claim 1, wherein the thickness of said oxynitride is between about 10 to 60 Å.

8. The method of claim 1, wherein said forming a tantalum oxide layer is accomplished by chemical vapor deposition (CVD) at a chamber pressure between about 50 to 100 Pa, temperature between about 400° C. to 475° C. with reactant gas $Ta(OC_2H_5)_5$ at a flow rate between about 5 to 20 sccm in a $N_2$ carrier gas and $O_2$ at a flow rate between about 10 to 40 sccm.

9. The method of claim 1, wherein the thickness of said tantalum oxide is between about 50 to 100 Å.

10. The method of claim 1, wherein said forming a titanium nitride layer is accomplished by sputtering of Ti in an $N_2$ ambient.

11. The method of claim 1, wherein the thickness of said titanium nitride is between about 100 to 500 Å.

12. A method of fabricating a CVD $Ta_2O_5$/Oxynitride stacked gate insulator with TiN gate electrode for sub-quarter micron MOSFETs comprising the steps of:
   providing a semiconductor substrate;
   forming a layer of gate oxide over said semiconductor substrate;
   oxynitridation of said layer of gate oxide to form a layer of two-step oxynitride;
   forming a tantalum oxide layer over said layer of two-step oxynitride;
   forming a titanium nitride layer over said tantalum oxide layer; and
   patterning and etching said oxynitride, tantalum oxide and titanium layers to complete the forming of said stacked gate.

13. The method of claim 12, wherein said semiconductor substrate is silicon.

14. The method of claim 12, wherein said forming a layer of gate oxide over said semiconductor substrate is accomplished by thermal oxidation at a temperature between about 750 to 900° C. to a thickness between about 10 to 60 Å.

15. The method of claim 12, wherein said oxynitridation of said layer of gate oxide to form a layer of two-step oxynitride is performed by reacting $N_2O$ or NO at the surface of said gate oxide.

16. The method of claim 12, wherein said oxynitridation of said layer of gate oxide to form a layer of two-step oxynitride is performed in a furnace at a temperature between about 850 to 1100° C. for between about 5 to 30 minutes.

17. The method of claim 12, wherein said oxynitridation of said layer of gate oxide to form a layer of two-step oxynitride is performed in a rapid thermal chamber at a temperature between about 850 to 1100° C. for between about 30 to 60 seconds.

18. The method of claim 12, wherein the thickness of said two-step oxynitride is between about 10 to 60 Å.

19. The method of claim 12, wherein said forming a tantalum oxide layer is accomplished by chemical vapor deposition (CVD) at a chamber pressure between about 50 to 100 Pa, temperature between about 400° C. to 475° C. with reactant gas $Ta(OC_2H_5)_5$ at a flow rate between about 5 to 20 sccm in a $N_2$ carrier gas and $O_2$ at a flow rate between about 10 to 40 sccm.

20. The method of claim 12, wherein the thickness of said tantalum oxide is between about 50 to 100 Å.

21. The method of claim 12, wherein said forming a titanium nitride layer is accomplished by sputtering of Ti in an $N_2$ ambient.

22. The method of claim 12, wherein the thickness of said titanium nitride is between about 100 to 500 Å.

* * * * *